United States Patent
Sakuma et al.

(10) Patent No.: US 9,786,683 B1
(45) Date of Patent: Oct. 10, 2017

(54) NONVOLATILE SEMICONDUCTOR MEMORY DEVICE AND METHOD OF MANUFACTURING THE SAME

(71) Applicant: Toshiba Memory Corporation, Minato-ku (JP)

(72) Inventors: Kiwamu Sakuma, Yokkaichi (JP); Keiji Ikeda, Kawasaki (JP); Masumi Saitoh, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/271,407

(22) Filed: Sep. 21, 2016

(30) Foreign Application Priority Data

Mar. 18, 2016 (JP) ................. 2016-054724

(51) Int. Cl.
*H01L 27/115* (2017.01)
*H01L 23/522* (2006.01)
*H01L 23/528* (2006.01)
*H01L 29/78* (2006.01)
*H01L 29/24* (2006.01)
*H01L 27/11582* (2017.01)
(Continued)

(52) U.S. Cl.
CPC .. *H01L 27/11582* (2013.01); *H01L 21/28282* (2013.01); *H01L 23/528* (2013.01); *H01L 27/11568* (2013.01); *H01L 27/11573* (2013.01); *H01L 29/0847* (2013.01); *H01L 29/42376* (2013.01)

(58) Field of Classification Search
CPC ......... H01L 27/11582; H01L 27/11568; H01L 27/11573; H01L 29/42376; H01L 29/0847; H01L 23/582; H01L 21/28282

USPC ............. 257/314, 316, 324, 774, E27.081, 257/E27.103, E29.3, E29.309, E21.209, 257/E21.422, E21.689; 365/185.05, 365/185.18, 185.23; 438/268, 269, 257, 438/301, 241
See application file for complete search history.

(56) References Cited

U.S. PATENT DOCUMENTS 7,612,378 B2  11/2009  Toyoda et al.
7,709,334 B2   5/2010  Lai et al.
(Continued)

FOREIGN PATENT DOCUMENTS

JP  2006-269808 A  10/2006
JP  2007-266143 A  10/2007
(Continued)

*Primary Examiner* — Dao H Nguyen
(74) *Attorney, Agent, or Firm* — Oblon, McClelland, Maier & Neustadt, L.L.P.

(57) ABSTRACT

This nonvolatile semiconductor memory device includes: a memory cell array including a memory cell; a wiring part connecting the memory cell array to an external circuit; and a transistor that connects the wiring part and the external circuit, the transistor including: a first insulating layer including a first region, a second region, and a third region, the second and third regions being disposed on both sides of the first region, and a height of an upper surface of the first region being lower than those of the second region and the third region; a semiconductor layer disposed along upper surfaces of the first region, the second region, and the third region; and a gate electrode layer disposed via the semiconductor layer and a gate insulating film, on an upper part of the second region.

15 Claims, 14 Drawing Sheets

(51) Int. Cl.
*H01L 27/11568* (2017.01)
*H01L 27/11573* (2017.01)
*H01L 29/423* (2006.01)
*H01L 29/08* (2006.01)
*H01L 21/28* (2006.01)

(56) References Cited

U.S. PATENT DOCUMENTS

| | | |
|---|---|---|
| 7,936,004 B2 | 5/2011 | Kito et al. |
| 8,766,255 B2 | 7/2014 | Isobe et al. |
| 8,779,432 B2 * | 7/2014 | Yamazaki ........... H01L 27/0688 |
| | | 257/330 |
| 9,203,023 B2 | 12/2015 | Saitoh et al. |
| 2015/0179660 A1 * | 6/2015 | Yada ................. H01L 21/02164 |
| | | 257/321 |
| 2016/0079259 A1 * | 3/2016 | Son ................... H01L 27/11573 |
| | | 257/401 |
| 2016/0141003 A1 | 5/2016 | Saitoh |
| 2016/0163732 A1 * | 6/2016 | Lim ................. H01L 27/11582 |
| | | 257/314 |
| 2016/0218224 A1 | 7/2016 | Ota et al. |
| 2016/0268304 A1 * | 9/2016 | Ikeda ................ H01L 27/11582 |

FOREIGN PATENT DOCUMENTS

| | | |
|---|---|---|
| JP | 2012-169611 A | 9/2012 |
| JP | 2012-209547 A | 10/2012 |
| JP | 2015-159260 A | 9/2015 |
| JP | 2016-100387 A | 5/2016 |
| JP | 2016-134578 A | 7/2016 |

\* cited by examiner

B-B Cross Section

A-A Arrow View

NONVOLATILE SEMICONDUCTOR MEMORY DEVICE AND METHOD OF MANUFACTURING THE SAME

CROSS REFERENCE TO RELATED APPLICATIONS

This application is based on and claims the benefit of priority from prior Japanese Patent Application No. 2016-054724, filed on Mar. 18, 2016, the entire contents of which are incorporated herein by reference.

FIELD

Embodiments described below relate to a nonvolatile semiconductor memory device.

BACKGROUND

Description of the Related Art

In recent years, a three-dimensional type nonvolatile semiconductor memory device has been gathering attention as a nonvolatile semiconductor memory device for achieving raising of integration level, without being confined to a limit of resolution of lithography technology.

Such a three-dimensional type nonvolatile semiconductor memory device includes a wiring part for connection to an external peripheral circuit. The wiring part is connected to the external peripheral circuit via the likes of a contact plug and upper layer wiring, via a switch transistor.

However, along with an increase in memory capacity, the number of switch transistors has ended up increasing, and this is a factor that hinders raising of the integration level.

DETAILED DESCRIPTION

A nonvolatile semiconductor memory device according to an embodiment includes: a memory cell array including a memory cell; a wiring part connecting the memory cell array to an external circuit; and a transistor that connects the wiring part and the external circuit, the transistor including: a first insulating layer including a first region, a second region, and a third region, the second and third regions being disposed on both sides of the first region, and a height of an upper surface of the first region being lower than those of the second region and the third region; a semiconductor layer disposed along upper surfaces of the first region, the second region, and the third region; and a gate electrode layer disposed via the semiconductor layer and a gate insulating film, on an upper part of the second region.

Next, nonvolatile semiconductor memory devices according to embodiments will be described in detail with reference to the drawings.

First Embodiment

Figure 1:
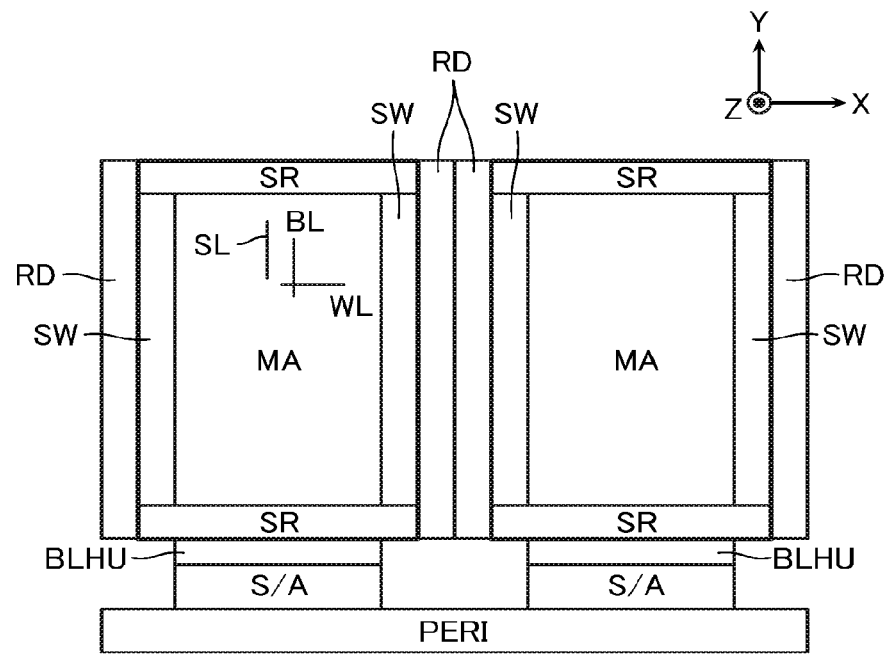
FIG. 1 is a block diagram showing a schematic configuration of a NAND type flash memory according to a first embodiment.

First, a NAND type flash memory according to a first embodiment will be described with reference to FIG. 1. As shown in FIG. 1, this NAND type flash memory of the first embodiment includes a memory cell array MA.

In addition, this NAND type flash memory includes a row decoder RD, a word line connection circuit SW, a bit line connection circuit BLHU, a sense amplifier circuit S/A, and a peripheral circuit PERI, in a periphery of the memory cell array MA.

As will be described later, the memory cell array MA has memory cells arranged three-dimensionally therein. Moreover, this memory cell array MA includes: a plurality of word lines WL that extend longitudinally in an X direction of FIG. 1; and a plurality of bit lines BL and a source line SL that extend longitudinally in a Y direction of FIG. 1. The plurality of word lines WL are stacked in a stacking direction (Z direction) in the memory cell array MA. The plurality of word lines WL are each connected to different memory cells MC arranged in the stacking direction in the memory cell array MA.

Figure 2:
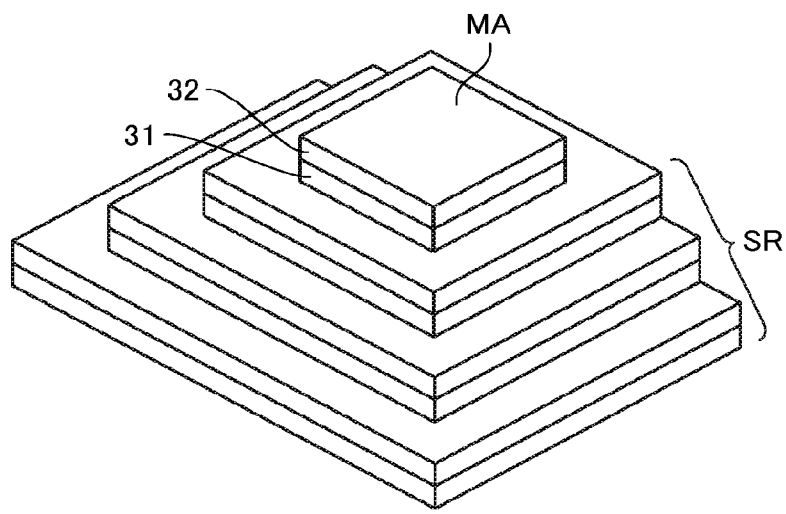
FIG. 2 is a perspective view showing a schematic configuration of a memory cell array MA and a stepped wiring part SR.

In addition, a stepped wiring part SR for connecting the word line WL and an external circuit is formed in the periphery of this memory cell array MA. As shown in FIG. 2, this stepped wiring part SR includes a lead-out wiring connected to an identical layer to a conductive layer 31 acting as the word line WL, and this lead-out wiring is formed in a stepped shape. The stepped wiring part SR is formed by etching stacked conductive layers 31 and interlayer insulating films 32 while performing slimming processing isotropically on a resist, by a well-known method. Therefore, as shown in FIGS. 1 and 2, the stepped wiring part SR is usually formed so as to surround all sides of the memory cell array MA.

The row decoder RD selects the plurality of word lines WL and supplies a voltage required in an operation. Moreover, the word line connection circuit SW is a switching circuit for connecting the word line WL and the row decoder RD, and includes many transistors SWTr that connect the word line WL and the row decoder RD. As will be described later, the transistor SWTr configuring this word line connection circuit SW is disposed so as to be superposed on the stepped wiring part SR in an XY plane, upwardly of the stepped wiring part SR.

Furthermore, the sense amplifier circuit S/A and the bit line connection circuit BLHU are disposed in the Y direction of the stepped wiring part SR. The sense amplifier circuit S/A is connected to the bit line BL via the bit line connection circuit BLHU, and functions to provide the bit line BL with a voltage for write and to detect and amplify a potential appearing in the bit line BL during read. The bit line connection circuit BLHU includes a transistor that controls connection of the bit line BL and the sense amplifier circuit S/A. The peripheral circuit PERI includes a circuit other than the above-described, for example, a power supply circuit, a charge pump circuit (booster circuit), a data register, and so on.

Figure 3:
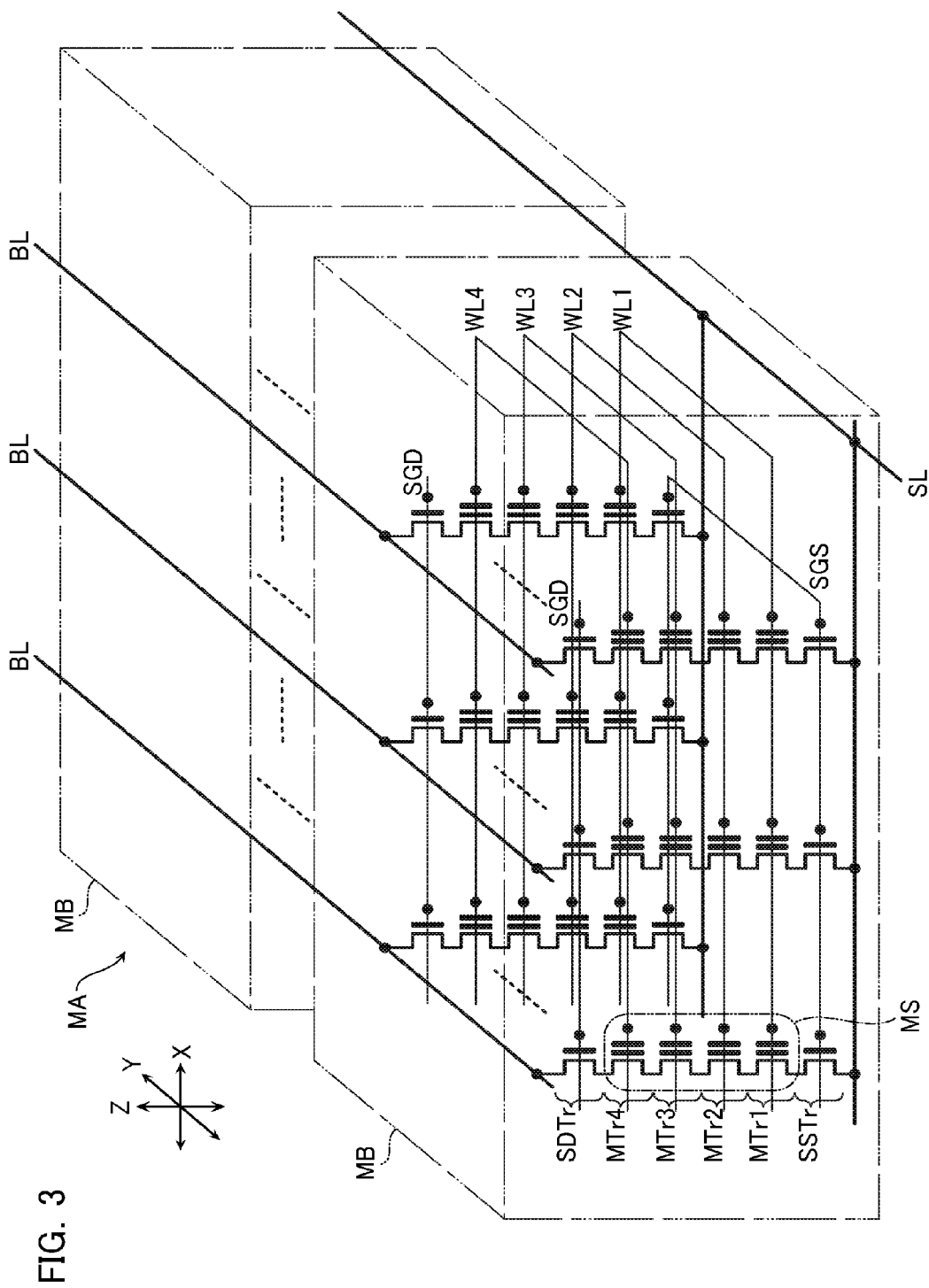
FIG. 3 is a circuit diagram describing a circuit configuration of the memory cell array MA.

Next, a circuit configuration of the memory cell array MA will be described. FIG. 3 is a circuit diagram of the memory cell array MA. Note that this structure of the memory cell array MA shown in FIG. 3 is merely an example. It goes without saying that a later-described structure of the word line connection circuit SW may be applied also to a variety of three-dimensional type memory cell arrays other than that shown.

As shown in FIG. 3, the memory cell array MA includes a plurality of memory blocks MB. The memory blocks MB are arranged in the Y direction on a semiconductor substrate Ba (not shown).

The memory block MB includes a plurality of memory strings MS, a source side select transistor SSTr, and a drain side select transistor SDTr. The memory string MS is configured by memory transistors (memory cells) MTr1-MTr4 connected in series. To simplify description, the example shown describes the case where one memory string MS includes four memory transistors MTr, but it goes without saying that the present embodiment is not limited to this, and one memory string MS may include more memory transistors.

The drain side select transistor SDTr is connected to one end of the memory string MS (the memory transistor MTr4). The source side select transistor SSTr is connected to the other end of the memory string MS (the memory transistor MTr1). For example, the memory strings MS are provided in a matrix in the XY plane over a plurality of rows and a plurality of columns, in each one of the memory blocks MB.

In the memory block MB, control gates of the memory transistors MTr1 arranged in a matrix are commonly connected to a word line WL1. Similarly, control gates of the memory transistors MTr2 are commonly connected to a word line WL2. Control gates of the memory transistors MTr3 are commonly connected to a word line WL3. Control gates of the memory transistors MTr4 are commonly connected to a word line WL4.

Moreover, in the memory block MB, control gates of each of the drain side select transistors SDTr arranged in a line in the X direction are commonly connected to a drain side select gate line SGD. A plurality of the drain side select gate lines SGD are provided at a certain pitch in the Y direction in one memory block MB. Moreover, other ends of the drain side select transistors SDTr arranged in a line in the Y direction are commonly connected to the bit line BL. The bit line BL is formed so as to extend in the Y direction straddling the memory block MB. A plurality of the bit lines BL are provided in the X direction.

In one memory block MB, control gates of all of the source side select transistors SSTr are commonly connected to a source side select gate line SGS. Moreover, other ends of the source side select transistors SSTr arranged in the Y direction are commonly connected to a source line SL.

Figure 4:
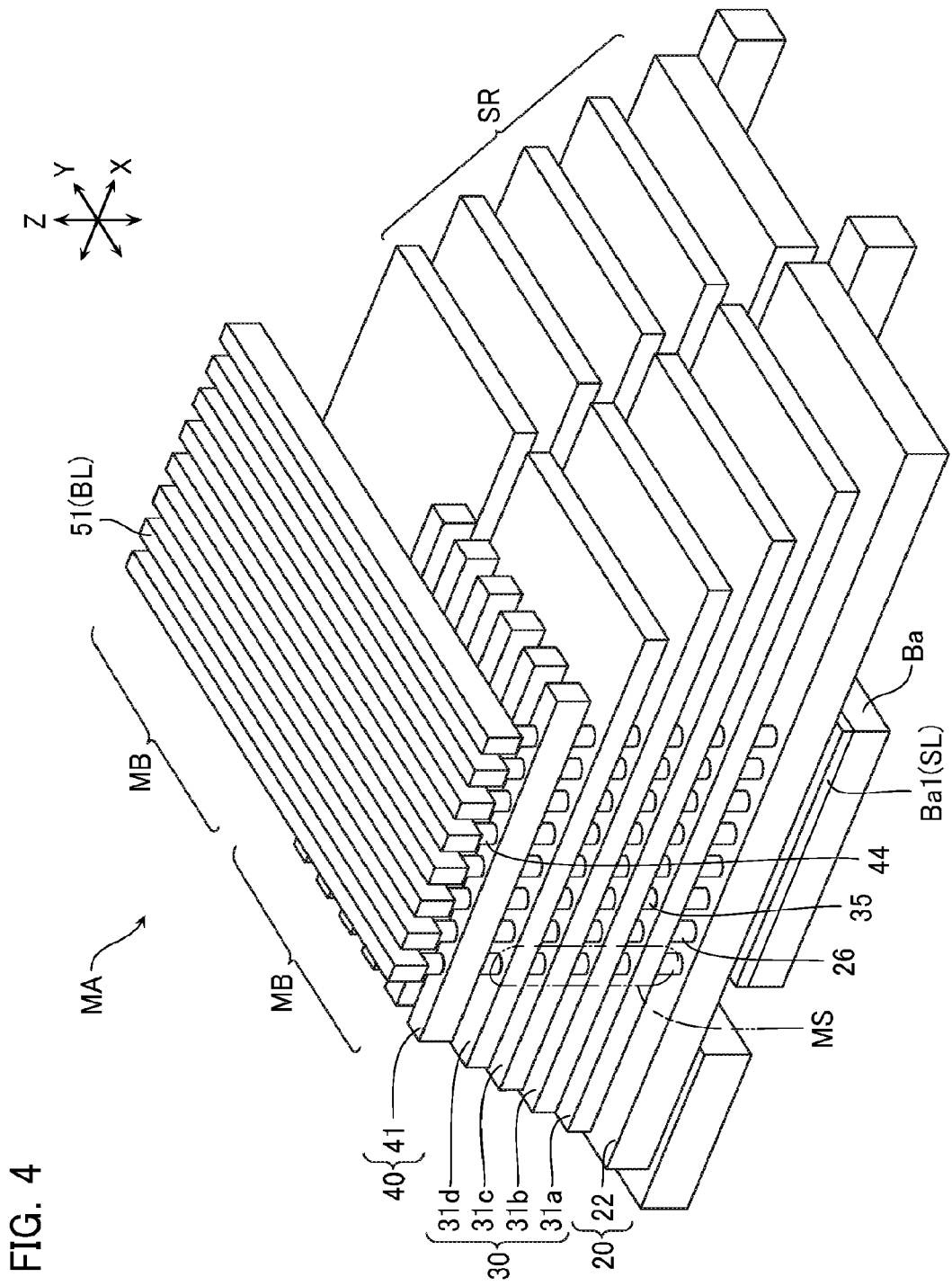
FIG. 4 is a schematic perspective view of the memory cell array MA.
Figure 5:
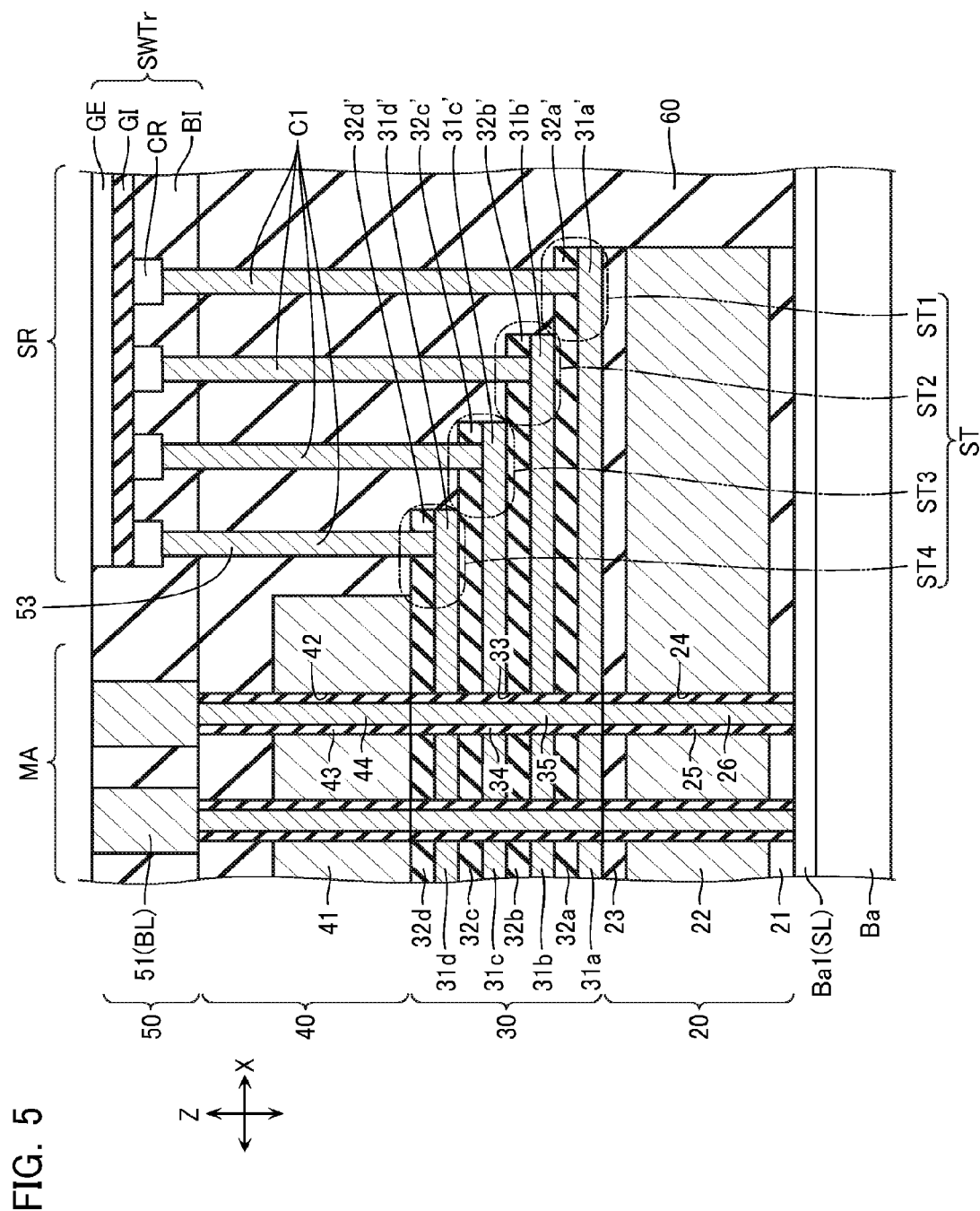
FIG. 5 is a cross-sectional view of the memory cell array MA and the stepped wiring part SR.

The above-described kind of circuit configuration of the memory cell array MA is achieved by a stacked structure shown in FIGS. 4 and 5. FIG. 4 is a schematic perspective view of the memory cell array MA. FIG. 5 is a cross-sectional view of the memory cell array MA and the stepped wiring part SR.

As shown in FIGS. 4 and 5, the memory cell array MA includes a source side select transistor layer 20, a memory transistor layer 30, a drain side select transistor layer 40, and a wiring layer 50 that are stacked sequentially on the semiconductor substrate Ba in each of the memory blocks MB.

The source side select transistor layer 20 is a layer functioning as the source side select transistor SSTr. The memory transistor layer 30 is a layer functioning as the memory string MS (memory transistors MTr1-MTr4). The drain side select transistor layer 40 is a layer functioning as the drain side select transistor SDTr. The wiring layer 50 is a layer functioning as various kinds of wirings.

As shown in FIGS. 4 and 5, the source side select transistor layer 20 includes a source side first insulating layer 21, a source side conductive layer 22, and a source side second insulating layer 23 that are formed sequentially above the semiconductor substrate Ba. The source side conductive layer 22 is formed so as to extend two-dimensionally (in a plate-like shape) in the X direction and the Y direction, over the memory block MB.

The source side first insulating layer 21 and the source side second insulating layer 23 are configured by silicon oxide ($SiO_2$), for example. The source side conductive layer 22 is configured by polysilicon (p-Si), for example. Moreover, as shown in FIG. 5, the source side select transistor layer 20 includes a source side hole 24 formed so as to penetrate the source side first insulating layer 21, source side conductive layer 22, and source side second insulating layer 23. The source side holes 24 are formed in a matrix in the X direction and the Y direction.

Furthermore, as shown in FIG. 5, the source side select transistor layer 20 includes a source side gate insulating layer 25 and a source side columnar semiconductor layer 26 that are formed sequentially on a sidewall facing the source side hole 24. The source side gate insulating layer 25 is formed with a certain thickness on the sidewall facing the source side hole 24. The source side columnar semiconductor layer 26 is formed so as to fill the source side hole 24. The source side columnar semiconductor layer 26 is formed in a column shape extending in the stacking direction. An upper surface of the source side columnar semiconductor layer 26 is formed so as to contact a lower surface of a later-described columnar semiconductor layer 35. The source side columnar semiconductor layer 26 is formed on a source diffusion layer Ba1 on the semiconductor substrate Ba. The source diffusion layer Ba1 functions as the source line SL.

The source side gate insulating layer 25 is configured by silicon oxide ($SiO_2$), for example. The source side columnar semiconductor layer 26 is configured by polysilicon (p-Si), for example.

In the above-described configuration of the source side select transistor layer 20, the source side conductive layer 22 functions as the control gate of the source side select transistor SSTr and as the source side select gate line SGS.

In addition, as shown in FIGS. 4 and 5, the memory transistor layer 30 includes first through fourth word line conductive layers 31a-31d and first through fourth inter-word line insulating films 32a-32d that are stacked sequentially on the source side select transistor layer 20. The first through fourth word line conductive layers 31a-31d and the first through fourth inter-word line insulating films 32a-32d are formed so as to extend two-dimensionally (in a plate-like shape) in the X direction and the Y direction. The first through fourth word line conductive layers 31a-31d and the first through fourth inter-word line insulating films 32a-32d are divided for each memory block MB.

Moreover, as shown in FIG. 5, the memory transistor layer 30 includes a memory hole 33 formed so as to penetrate the first through fourth word line conductive layers 31a-31d and the first through fourth inter-word line insulating films 32a-32d. The memory holes 33 are formed in a matrix in the X direction and the Y direction. The memory hole 33 is formed at a position aligned with the source side hole 24.

Figure 6:
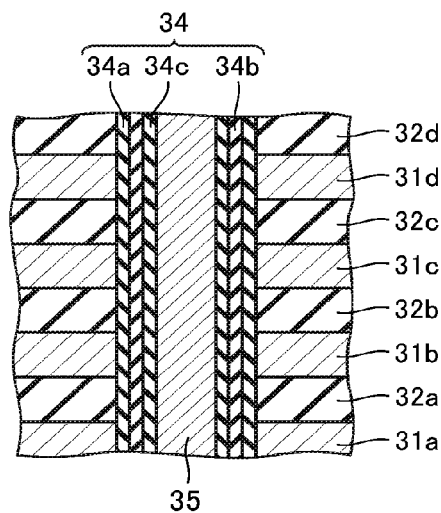
FIG. 6 is a cross-sectional view showing details of a structure of a memory transistor layer 30.

Furthermore, as shown in FIG. 6, the memory transistor layer 30 includes a block insulating layer 34a, a charge accumulation layer 34b, a tunnel insulating layer 34c, and the columnar semiconductor layer 35 that are formed sequentially on a sidewall facing the memory hole 33.

As shown in FIG. 6, the block insulating layer 34a is formed with a certain thickness on the sidewall facing the memory hole 33. The charge accumulation layer 34b is formed with a certain thickness on a sidewall of the block insulating layer 34a. The tunnel insulating layer 34c is formed with a certain thickness on a sidewall of the charge accumulation layer 34b. The columnar semiconductor layer 35 is formed so as to fill the memory hole 33. The columnar semiconductor layer 35 is formed in a column shape so as to extend in the stacking direction. The lower surface of the columnar semiconductor layer 35 is formed so as to contact the upper surface of the source side columnar semiconductor layer 26. Moreover, an upper surface of the columnar semiconductor layer 35 is formed so as to contact a lower surface of a later-described drain side columnar semiconductor layer 44. Note that the columnar semiconductor layer 35 may also be configured having an insulating film core at its center. Note that the block insulating layer 34a and the tunnel insulating layer 34c are configured by silicon oxide ($SiO_2$), for example. The charge accumulation layer 34b is configured by silicon nitride (SiN), for example. The columnar semiconductor layer 35 is configured by polysilicon (p-Si), for example.

In the above-described configuration of the memory transistor layer 30, the first through fourth word line conductive layers 31a-31d function as the control gates of the memory transistors MTr1-MTr4 and as the word lines WL1-WL4.

As shown in FIGS. 4 and 5, the drain side select transistor layer 40 includes a drain side conductive layer 41 stacked on the memory transistor layer 30. The drain side conductive layer 41 is formed directly above where the columnar semiconductor layer 35 is formed. The drain side conductive layers 41 extend having longitudinally the X direction, and are formed in stripes with a certain pitch in the Y direction. The drain side conductive layer 41 is configured by polysilicon (p-Si), for example.

Moreover, as shown in FIG. 5, the drain side select transistor layer 40 includes a drain side hole 42 formed so as to penetrate the drain side conductive layer 41. The drain side holes 42 are formed in a matrix in the X direction and the Y direction. The drain side hole 42 is formed at a position aligned with the memory hole 33.

Furthermore, as shown in FIG. 5, the drain side select transistor layer 40 includes a drain side gate insulating layer 43 and a drain side columnar semiconductor layer 44 that are formed sequentially on a sidewall facing the drain side hole 42. The drain side gate insulating layer 43 is formed with a certain thickness on the sidewall facing the drain side hole 42. The drain side columnar semiconductor layer 44 is formed so as to fill the drain side hole 42. The drain side columnar semiconductor layer 44 is formed in a column shape so as to extend in the stacking direction. The lower surface of the drain side columnar semiconductor layer 44 is formed so as to contact the upper surface of the columnar semiconductor layer 35. Note that the drain side gate insulating layer 43 is configured by silicon oxide ($SiO_2$) for example. The drain side columnar semiconductor layer 44 is configured by polysilicon (p-Si), for example. The drain side conductive layer 41 functions as the control gate of the drain side select transistor SDTr and as the drain side select gate line SGD.

As shown in FIG. 5, the wiring layer 50 includes the likes of a first wiring layer 51 in a region including the memory cell array MA, and includes the likes of a channel semiconductor layer CR, a gate insulating film GI, and a gate electrode layer GE in a region including the stepped wiring part SR.

The first wiring layer 51 is formed so as to contact an upper surface of the drain side columnar semiconductor layer 44. The first wiring layers 51 are formed with a certain pitch in the X direction so as to extend in the Y direction. The first wiring layer 51 functions as the bit line BL.

Moreover, the channel semiconductor layer CR, the gate insulating film GI, and the gate electrode layer GE are members configuring the previously described transistor SWTr in the word line connection circuit SW. The channel semiconductor layer CR functions as a channel region of these transistors SWTr. As will be described later, the gate insulating film GI is formed on a surface of the channel semiconductor layer CR, and the gate electrode layer GE is formed on the surface of the channel semiconductor layer CR via this gate insulating film GI.

The channel semiconductor layer CR may be configured by, for example, polysilicon, monocrystalline silicon, $TiO_2$, or a semiconductor oxide (for example, InGaZnO, ZnO, InOx, and so on).

The gate insulating film GI is configured from a silicon oxide ($SiO_x$), for example. The gate insulating film GI, besides being configured from a silicon oxide, may also be configured from at least one of silicon nitride (SiN), silicon oxynitride (SiON), aluminum oxide ($Al_2O_3$), aluminum oxynitride (AlON), hafnia ($HfO_2$), hafnium aluminate ($HfAlO_3$), hafnium oxynitride (HfON), hafnium aluminate nitride (HfAlON), hafnium silicate (HfSiO), hafnium silicate nitride (HfSiON), lanthanum oxide ($La_2O_3$), and lanthanum aluminate ($LaAlO_3$).

The gate electrode layer GE may be formed from, for example, polysilicon or polysilicon to which an impurity has been added. The following may be included instead of polysilicon, namely a metal compound such as tantalum nitride (TaN), tantalum carbide (TaC), and titanium nitride (TiN), or the following that show metallic electrical conductivity characteristics, namely Ni, V, Cr, Mn, Y, Mo, Ru, Rh, Hf, Ta, W, Ir, Co, Ti, Er, Pt, Pd, Zr, Gd, Dy, Ho, Er, and silicides of these.

As shown in FIG. 5, the stepped wiring part SR includes conductive layers 31a'-31d' formed by extending the first through fourth word line conductive layers 31a-31d. That is, the conductive layers 31a'-31d' are formed in identical layers to, and are electrically and physically connected to the first through fourth word line conductive layers 31a-31d. The conductive layers 31a'-31d' and first through fourth inter-word line insulating films 32a'-32d' sandwiched between the conductive layers 31a'-31d' are formed in a stepped shape such that positions of their ends in the X direction differ, and configure a stepped part ST. The stepped part ST (ST1-ST4) in FIG. 5 configures part of the stepped wiring part SR of the kind shown in FIG. 2. The stepped part ST shown specifically in FIG. 5 includes the stepped parts ST1-ST4 formed by the conductive layers 31a'-31d' and the first through fourth inter-word line insulating films 32a'-32d' the positions of whose ends differ in the X direction.

A contact plug C1 having longitudinally the stacking direction (Z direction) extends from each of these stepped parts ST1-ST4, so as to penetrate the first through fourth inter-word line insulating films 32a'-32d'.

As shown in FIG. 5, an inter-layer insulating layer 60 is formed so as to fill a periphery of the source side select transistor layer 20, the memory transistor layer 30, and the drain side select transistor layer 40.

A structure of the transistor SWTr according to the present embodiment will be described with reference to FIGS. 7 and 8.

Figure 7:
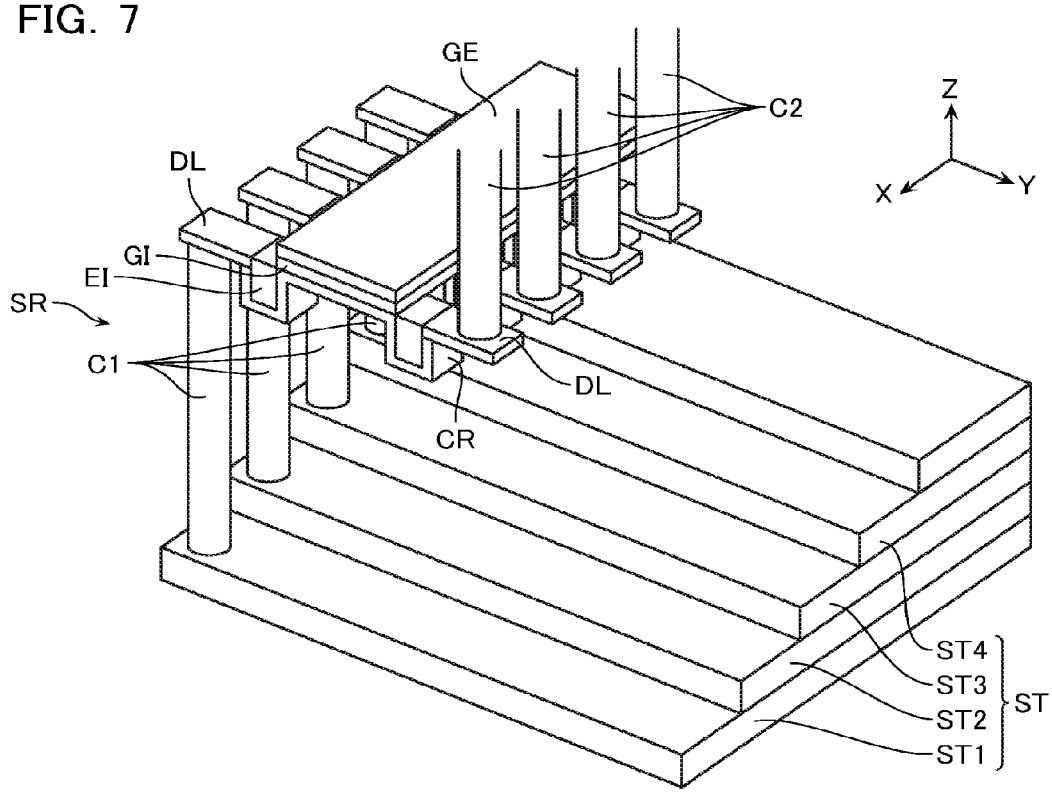
FIG. 7 is a perspective view showing a structure of a transistor SWTr included in a word line connection circuit SW formed in an upper part of the stepped wiring part SR, of the first embodiment.

FIG. 7 is a perspective view showing the structure of the transistor SWTr included in the word line connection circuit SW formed in an upper part of the stepped wiring part SR. FIG. 8 is a cross-sectional view in a YZ plane of the transistor SWTr formed in the upper part of the stepped wiring part SR. Note that to simplify illustration, FIG. 7 does not show the inter-layer insulating layer 60.

Figure 8:
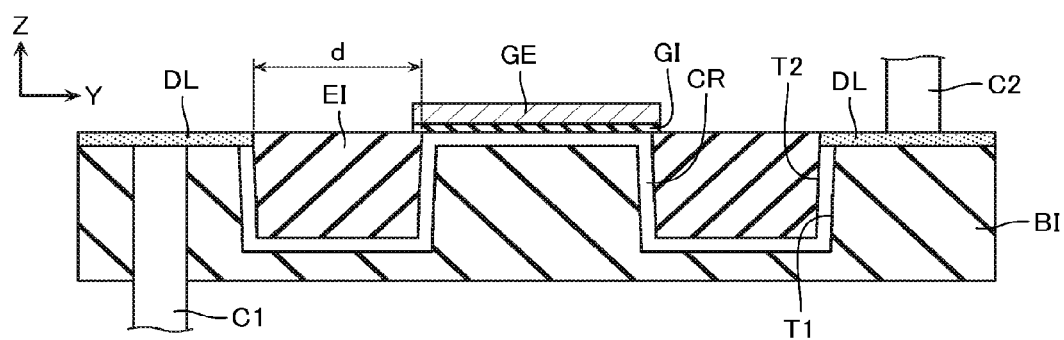
FIG. 8 is a cross-sectional view of the transistor SWTr formed in the upper part of the stepped wiring part SR.

As shown in FIGS. 7 and 8, the transistor SWTr included in the word line connection circuit SW includes a base insulating layer BI (first insulating layer), the channel semiconductor layer CR (semiconductor layer), the gate insulating film GI, the gate electrode layer GE, an embedded insulating layer EI (second insulating layer), and a diffusion layer DL (impurity layer). These channel semiconductor layer CR, gate insulating film GI, and gate electrode layer GE form a MOS structure, and configure a thin film transistor (TFT) structure in which a current flowing between the diffusion layers DL is controlled by applying a voltage to the gate electrode layer GE.

As shown in FIG. 7, the channel semiconductor layer CR is formed along a longitudinal direction of the stepped parts ST1-ST4. In the case of such a configuration, many channel semiconductor layers CR can be disposed along a shape of the stepped part ST, and it becomes easy for more transistors SWTr to be formed.

In the example shown in FIG. 7, the gate electrode layer GE of this embodiment is commonly (continuously) connected over a plurality of the channel semiconductor layers CR. As a result, one gate electrode layer GE (of plate-like shape) is connected to a plurality of the transistors SWTr, and the number of upper layer wirings or contact plugs can be reduced. The gate electrode layer GE is not limited to such a configuration, and may be provided independently to each different transistor SWTr.

Moreover, as shown in FIGS. 7 and 8, an upper end of the contact plug C1 is connected to one end (a back surface) of the channel semiconductor layer CR where the diffusion layer DL is formed. On the other hand, a contact plug C2 separate from the contact plug C1 is connected to the other end (a front surface) of the channel semiconductor layer CR. An upper layer wiring Ml (not shown) is connected to an upper end of the contact plug C2. This upper layer wiring Ml is connected to the row decoder RD via another contact plug or wiring in an unshown region.

In the example shown in FIG. 8, the base insulating layer BI includes two trenches T1 (concave parts), and the channel semiconductor layer CR is deposited so as to cover a surface of the base insulating layer BI. A trench T2 is formed by an upper surface of the channel semiconductor layer CR following the trench T1. The case where cross sections of the trenches T1 and T2 are rectangular is shown, but another shape may also be adopted for the trenches T1 and T2. For example, the cross sections of the trenches T1 and T2 may be configured as the likes of a trapezoid, a triangle, a polygon, a semi-ellipse, or a semi-circle. Moreover, FIG. 8 shows the case where the two trenches T1 have a similar shape, but they may be configured such that their depths in the stacking direction or shapes are different.

By thus forming the trench T1 in the base insulating layer BI and forming the channel semiconductor layer CR on the surface of the base insulating layer BI so as to also follow the trench T1, a channel length of the transistor SWTr can be made larger than when the trench T1 is not formed. Note that the number or size and shape of the trenches T1 (first regions) may be appropriately changed, and are of course not limited to those shown.

As shown in FIG. 8, in a region (convex part) sandwiched by the two trenches T1, the gate electrode layer GE is formed via the channel semiconductor layer CR and the gate insulating film GI, above the base insulating layer BI. The trench T1 formed in the base insulating layer BI is embedded by the channel semiconductor layer CR and the embedded insulating layer EI formed on the channel semiconductor layer CR. Now, a region where the trench T1 is formed, of the base insulating layer BI, is assumed to be a first region; a region where the gate electrode layer GE is formed, of the base insulating layer BI, is assumed to be a second region; and a region other than the first region and the second region, of the base insulating layer BI, is assumed to be a third region. That is, the trench T1 is formed by the first region having a height of its upper surface configured lower than those of the second region and the third region. In the example shown, the upper surface of the second region and the upper surface of the third region have the same height. As shown, the embedded insulating layer EI is planarized so as to attain the same height as the upper surfaces of the channel semiconductor layer CR on the second region and the third region.

In the example shown in FIG. 8, the gate electrode layer GE is formed in an upper part of the second region sandwiched by inner sidewall surfaces of the two trenches T1, and the diffusion layer DL is formed in each of the third regions adjacent to outer sidewall surfaces of the two trenches T1. In other words, the diffusion layer DL is formed at both ends of the channel semiconductor layer CR. In other words, the transistor SWTr includes: a first insulating layer having on its surface a concave part and a convex part adjacent to the concave part; a semiconductor layer disposed along the surface including the concave part and the convex part of the first insulating layer; and a gate electrode layer disposed via the semiconductor layer and a gate insulating film, on the convex part. By adopting such a structure, the channel length of the transistor SWTr can be made larger than when the trench T1 is not formed. A method of manufacturing such a transistor structure will be described later.

The diffusion layer DL is formed by an impurity being implanted in part of the channel semiconductor layer CR, and functions as a source/drain region of the transistor SWTr. A region between the second region where the gate electrode layer GE is formed and the diffusion layer DL, of the channel semiconductor layer CR, that is, the channel semiconductor layer CR along a sidewall surface and upper surface of the first region is not implanted with an impurity, or is implanted with an impurity of a concentration 10 times or more less compared to that of the diffusion layer DL. This region is called an offset region of the diffusion layer DL. For example, a large offset region is required as a means for improving withstand voltage when a high voltage is applied to the gate electrode layer GE or drain.

As shown in FIG. 8, the transistor SWTr of the present embodiment is formed such that part of the offset region follows a bottom surface and sidewall surface of the trench T1 formed in the base insulating layer BI, and has a partly folded kind of shape. Forming in this way makes it possible for a transistor SWTr provided with a large offset region to be made small on a plane, hence a reduction of chip area can be achieved. Now, when an offset length in a plane indicated by d in FIG. 8 is small, respective potentials interfere with each other between the gate electrode and diffusion layers, hence an offset effect ends up weakening. Therefore, it is desirable that an offset length d is to a certain extent large. Specifically, the offset length d is desirably 600 nm or more.

Moreover, in the present embodiment, the trench T1 formed in the base insulating layer BI has an aspect ratio in cross section whose value is close to 1.

Next, manufacturing steps of the transistor according to the first embodiment will be described with reference to FIGS. 9A to 9H.

Figure 9A:
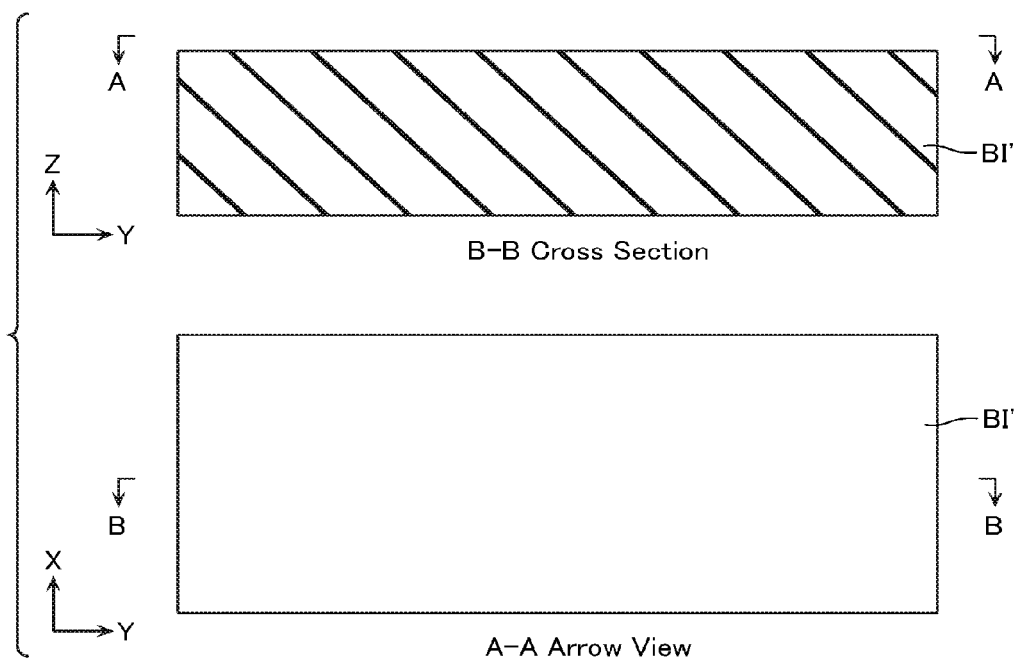
FIGS. 9A to 9H show a method of manufacturing the transistor SWTr according to the first embodiment.
Figure 9B:
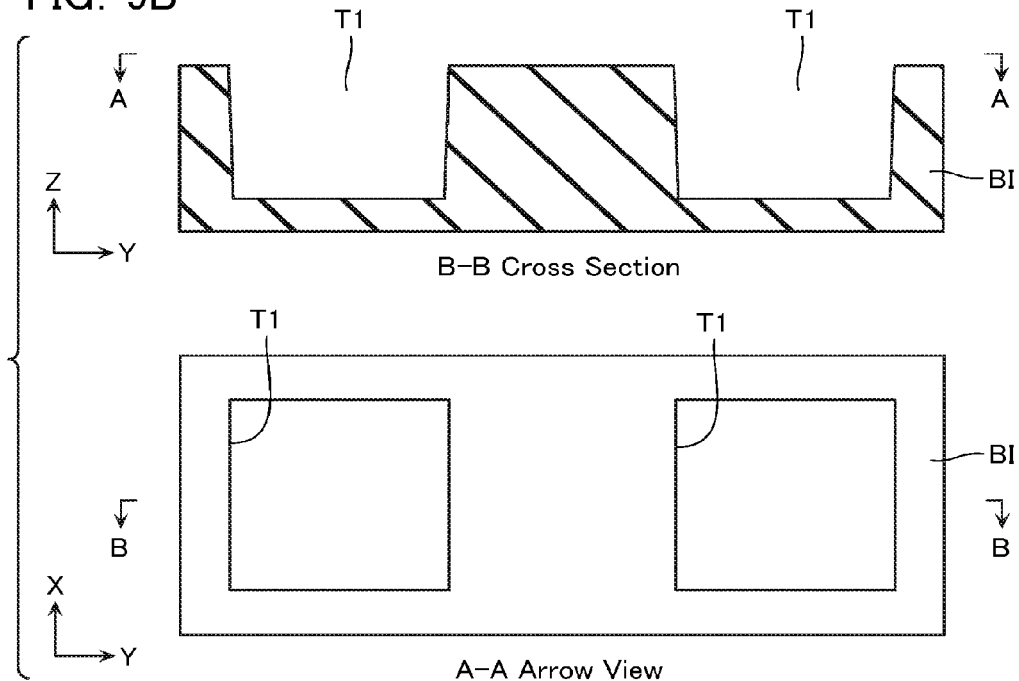
Figure 9C:
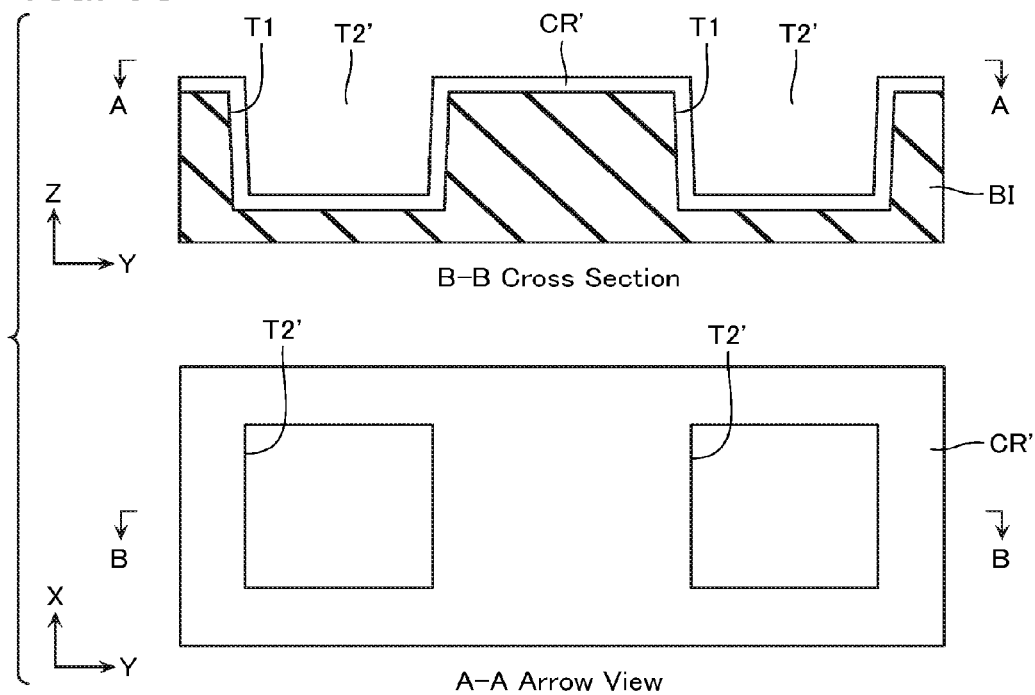
Figure 9D:
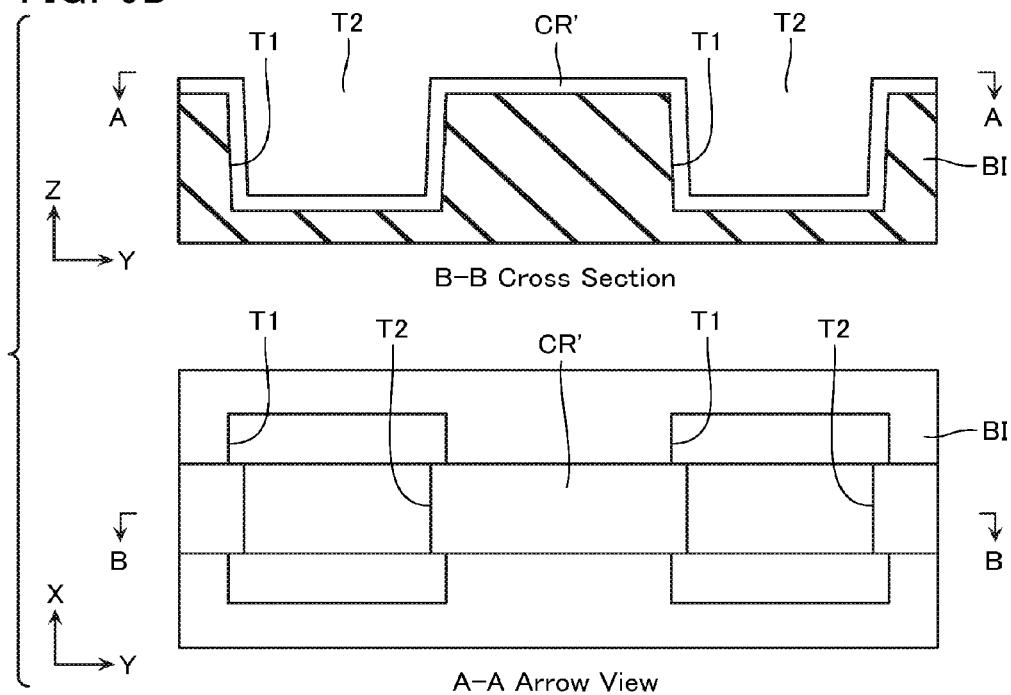
Figure 9E:
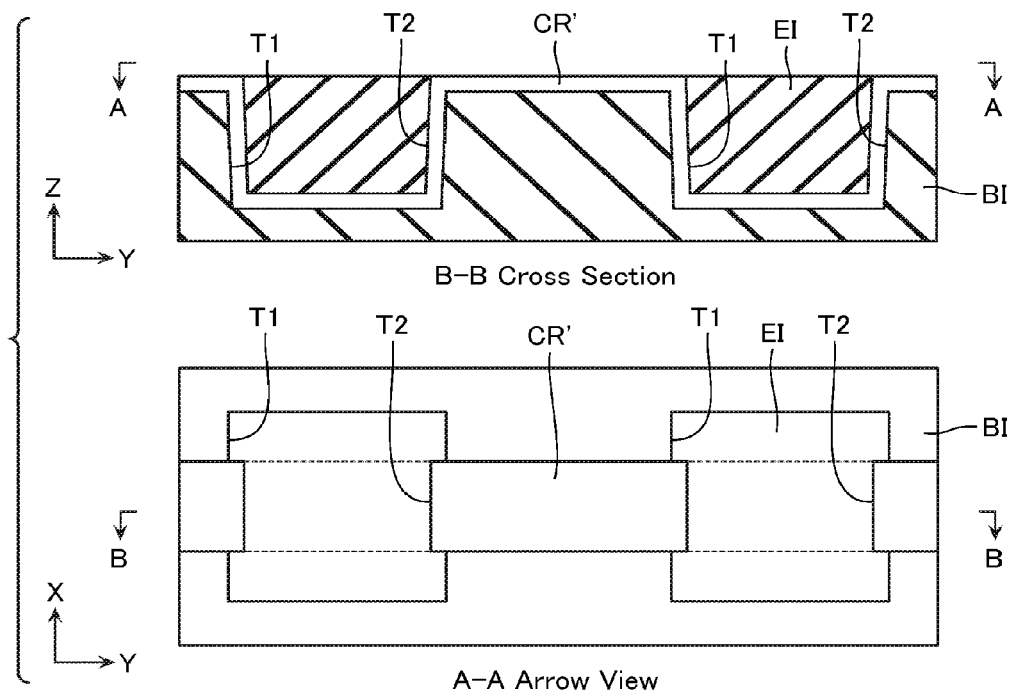
Figure 9F:
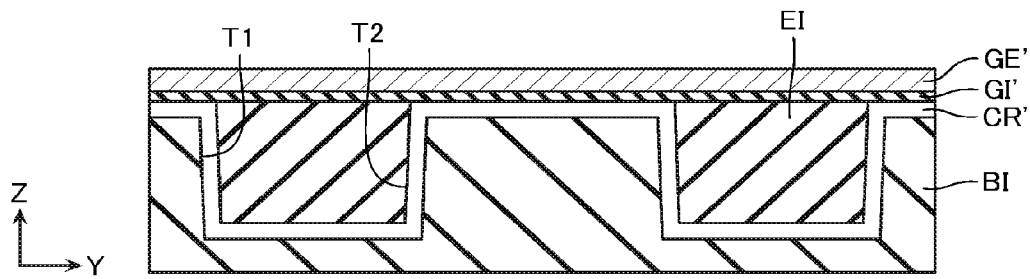
Figure 9G:
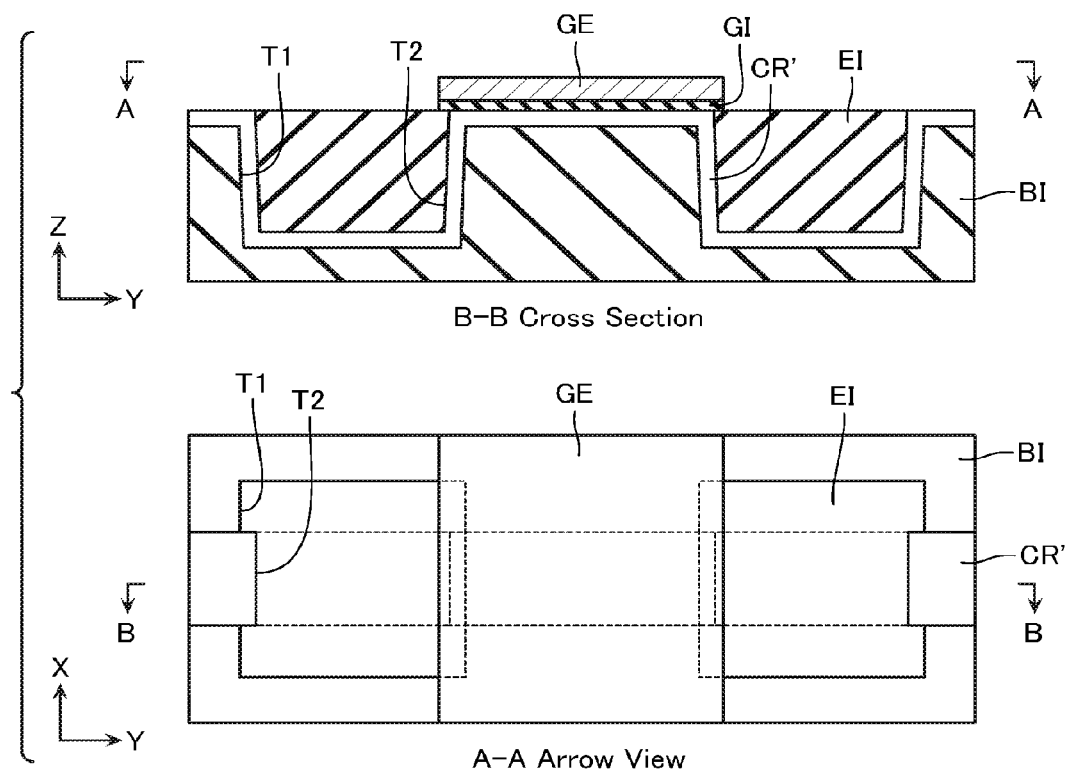
Figure 9H:
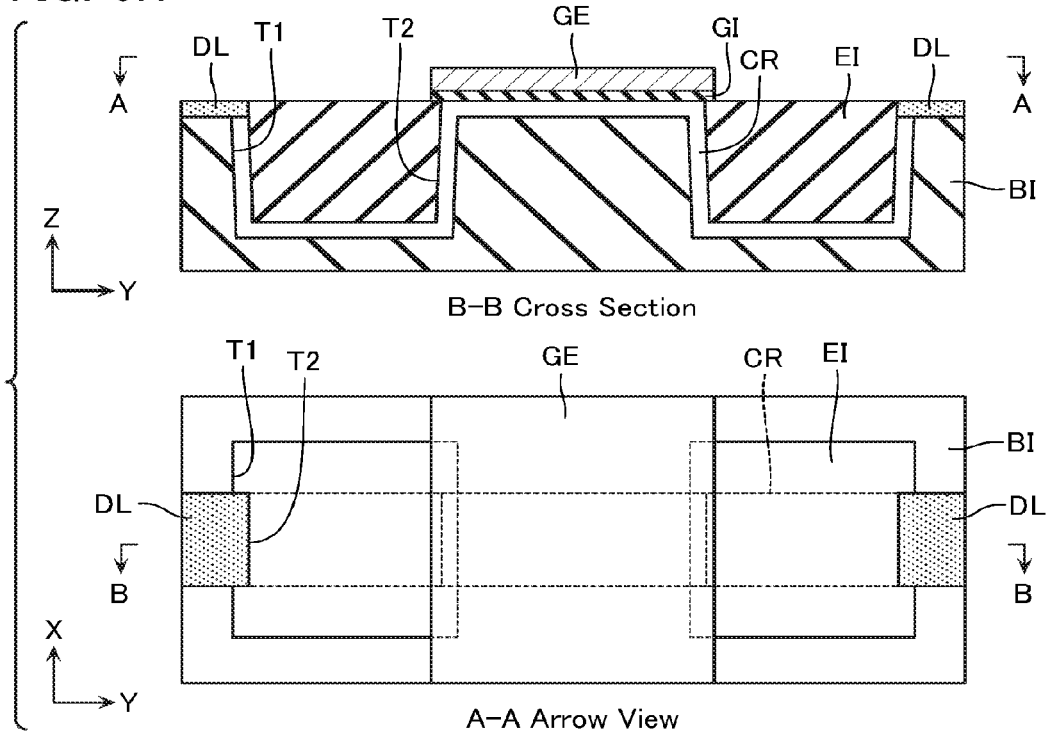

Upper portions of FIGS. 9A to 9E, FIG. 9F, and upper portions of FIGS. 9G and 9H are cross-sectional views in the YZ plane; and lower portions of FIGS. 9A to 9E, 9G, and 9H are arrow views of the XY plane as seen from above.

First, as shown in FIG. 9A, a base insulating layer 131' which will become the base insulating layer BI is formed by depositing silicon oxide ($SiO_2$), for example. Next, as shown in FIG. 9B, the two trenches T1 are formed in part of the base insulating layer BI' by implementing anisotropic dry etching after patterning by photolithography, for example, whereby the base insulating layer BI is formed. The base insulating layer BI may be formed by silicon nitride (SiN), for example, instead of silicon oxide.

Next, as shown in FIG. 9C, polysilicon, for example, is deposited so as to follow a surface of the base insulating layer BI including a bottom surface and sidewall surface of the trench T1, and a channel semiconductor layer CR' which will become the channel semiconductor layer CR is deposited. As a result, a trench T2' which will become the trench T2 in a later step, is formed.

Next, as shown in FIG. 9D, in order that the channel semiconductor layer CR' on parts of the second region and the third region and part of the channel semiconductor layer CR' in the trench T1 are continuous, another part of the channel semiconductor layer CR' is removed by implementing anisotropic dry etching after patterning by photolithography, for example, whereby the channel semiconductor layer CR' undergoes division processing in the X direction. As a result, an upper surface of the channel semiconductor layer CR' divided in the trench T1 becomes the trench T2. Moreover, division of the channel semiconductor layer CR' results in part of the trench T1 being exposed. At this time, the channel semiconductor layer CR', by undergoing division processing in the X direction without being divided in the Y direction, attains a shape extending as a whole in the Y direction so as to follow surfaces of the second region and the third region and a bottom surface and sidewall surface of the trench T1. Note that channel semiconductor layers CR and CR' formed with a uniform thickness along the trench T1 are described for reference, but the likes of shape, size or thickness may be arbitrarily changed.

Next, as shown in FIG. 9E, the embedded insulating layer EI (for example, silicon oxide) is deposited on the trenches T1 and T2, and planarization processing by CMP (Chemical Mechanical Polishing) is further implemented, whereby the trenches T1 and T2 are embedded. The embedded insulating layer EI may be formed by silicon nitride instead of silicon oxide.

Next, as shown in FIG. 9F, for example, polysilicon and polysilicon to which an impurity has been added are deposited in this order, and a gate insulating film GI' which will become the gate insulating film GI and a gate electrode layer GE' which will become the gate electrode layer GE are formed on surfaces of the embedded insulating layer EI and a convex part of the channel semiconductor layer CR'.

Next, as shown in FIG. 9G, the gate electrode layer GE' undergoes division processing in the X direction by implementing anisotropic dry etching after patterning by photolithography, for example. At this time, the gate insulating film GI' need not be divided. Moreover, an end of the gate electrode GE is formed so as to overlap in the Z direction the channel semiconductor layer CR' formed along a sidewall surface on a gate electrode layer GE side of the trench T1.

Next, as shown in FIG. 9H, an impurity is implanted in an entire surface of the base insulating layer BI by ion implantation, for example, and the diffusion layer DL is formed at both ends of the channel semiconductor layer CR, whereby the same structure as in FIG. 8 is formed. At this time, the gate electrode layer GE is formed so as to overlap the channel semiconductor layer CR. That is, a length in the X direction of the gate electrode layer GE is formed so as to be larger than a length in the X direction of the channel semiconductor layer CR on the second region. As a result, due to the gate electrode layer GE or the embedded insulating layer EI, it is difficult for the impurity to be implanted in, respectively, the second region directly below the gate electrode layer GE or a region where the trench T1 has been embedded (first region). Therefore, the diffusion layer DL can be formed by self-alignment by a method implanting the entire surface without performing patterning by photolithography, and a low cost can be achieved. Possible materials of the impurity of the diffusion layer DL and the offset region when implanted with the impurity at low concentration, are an impurity configuring an n type semiconductor, for example, a pentavalent element such as arsenic (As) and phosphorus (P), an impurity configuring a p type semiconductor, for example, a trivalent element such as boron (B) and indium (In), or a combination of these materials.

Figure 10:
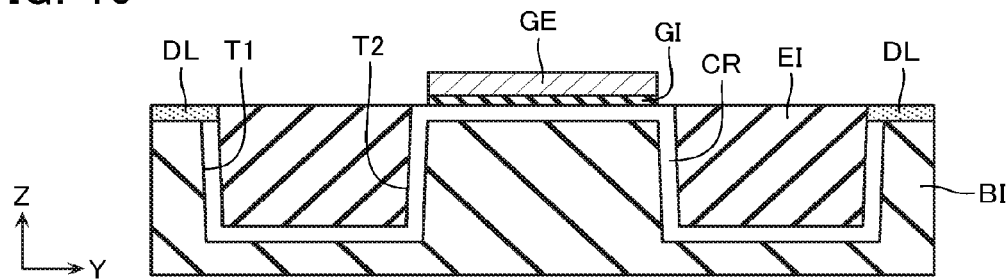
FIG. 10 shows a modified example of the transistor SWTr according to the first embodiment.
Figure 11:
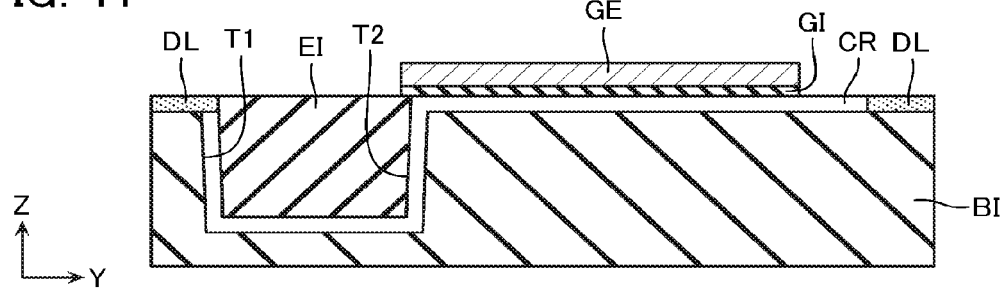
FIG. 11 shows a modified example of the transistor SWTr according to the first embodiment.

Modified examples of the transistor SWTr according to the first embodiment are shown with reference to FIGS. 10 and 11. In the case of FIG. 10, the gate electrode layer GE does not overlap the channel semiconductor layer CR. Even in this case, a similar structure is obtained by performing patterning by photolithography, for example.

In the case of FIG. 11, only one trench T1 is formed in the base insulating layer BI. That is, the base insulating layer BI includes the following in its B-B cross section, sequentially from the left side of FIG. 11, namely: the third region where the diffusion layer DL is formed; the first region where the trench T1 is formed; the second region having the gate electrode layer GE formed in its upper part; and the third region having the diffusion layer DL formed at its end. Even in this case, the first region has a height of its upper surface configured lower than those of the second region and the third region. By making the trench T1 only on one side of the gate electrode layer GE in this way, it is also possible to make a different offset length and to form a transistor SWTr in which a current is easily led out only from the diffusion layer DL on one side configuring a short offset.

Second Embodiment

Next, a second embodiment will be described with reference to FIGS. 12 to 14. An overall configuration of a nonvolatile semiconductor memory device according to the second embodiment is similar to that of the first embodiment (FIGS. 1 to 6), hence a detailed description thereof will be omitted. In the second embodiment, the structure of the transistor SWTr is different from in the first embodiment.

Figure 12:
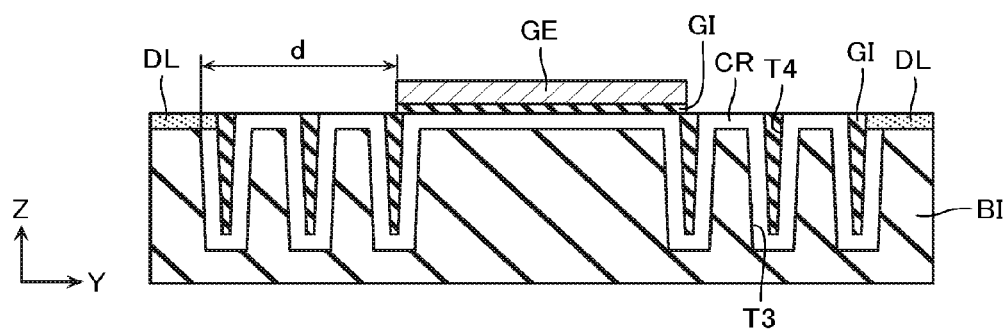
FIG. 12 is a cross-sectional view showing a structure of a transistor SWTr according to a second embodiment.

FIG. 12 is a cross-sectional view in the YZ plane of the transistor SWTr according to the second embodiment. Similarly to in the first embodiment, the transistor SWTr includes the base insulating layer BI (first insulating layer), the channel semiconductor layer CR (semiconductor layer), the gate insulating film GI, the gate electrode layer GE, and the diffusion layer DL. In addition, part of the channel semiconductor layer CR is formed so as to follow a bottom surface and sidewall surface of a trench T3 formed in the base insulating layer BI, and has a folded kind of shape. A trench T4 is formed by an upper surface of the channel semiconductor layer CR along the trench T3. The case where cross sections of the trenches T3 and T4 are trapezoids is shown, but another shape may also be adopted for the trenches T3 and T4. The example shown shows the case where each of the trenches T3 and T4 respectively all have similar shapes, but the present embodiment is not limited to this, and each of the trenches T3 and T4 may also be given different shapes. Moreover, the diffusion layer DL is formed at both ends of the channel semiconductor layer CR. Now, similarly to in the first embodiment, a region where the trench T3 is formed, of the base insulating layer BI, is assumed to be a first region; a region where the gate electrode layer GE is formed, of the base insulating layer BI, is assumed to be a second region; and a region other than the first region and the second region, of the base insulating layer BI, is assumed to be a third region. Even in the second embodiment, the first region has a height of its upper surface configured lower than those of the second region and the third region.

In the present embodiment, contrary to in the first embodiment, a plurality (in FIG. 12, three each on either side, a total of six) of the trenches T3 are formed in a region between the second region where the gate electrode layer GE is formed and the diffusion layer DL. That is, the base insulating layer BI includes three first regions on both sides sandwiching the second region where the gate electrode GE is formed, and has a structure in its B-B cross section that includes the following, sequentially from the left side of FIG. 12, namely: three each alternately of the third regions and the first regions; the second region; and three each alternately of the first regions and the third regions. Moreover, contrary to in the first embodiment, aspect ratios in cross section of each of the trenches T3 are formed so as to be larger than 1. By thus forming a plurality of long-and-thin trenches T3 respectively on both sides sandwiching the gate electrode layer GE, it is possible that while the offset length in the plane indicated by d in FIGS. 8 and 12 is maintained unchanged, an effective offset length is further increased. Moreover, the trench T3 formed in the base insulating layer BI is embedded simultaneously to when the gate insulating film GI is formed on the channel semiconductor layer CR. Details of this embedding will be described in the following manufacturing steps.

Manufacturing steps of the transistor according to the second embodiment will be described with reference to FIGS. 13A to 13F. Upper portions of FIGS. 13A to 13F are cross-sectional views in the YZ plane; and lower portions of FIGS. 13A to 13F are arrow views of the XY plane as seen from above.

Figure 13A:
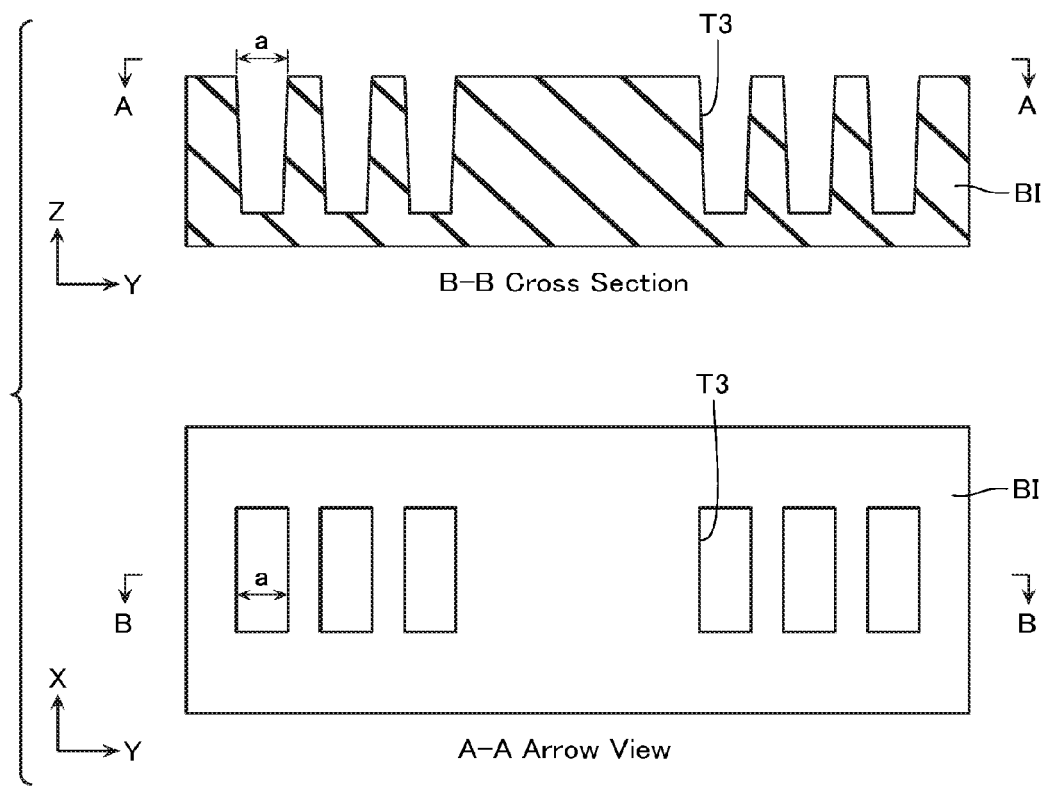
FIGS. 13A to 13F show a method of manufacturing the transistor SWTr according to the second embodiment.

First, as shown in FIG. 13A, the base insulating layer BI formed by depositing silicon oxide ($SiO_2$) has the trench T3 formed therein, by performing patterning by photolithography and then implementing anisotropic dry etching. At this time, contrary to in the case of FIG. 9B, patterning is performed such that a plurality of the trenches T3 are respectively formed on both sides of the region where the gate electrode layer GE is formed (second region). At this time, contrary to in the first embodiment, aspect ratios of each of the trenches T3 are formed so as to be larger than 1. By forming the trench T3 in this way, even if a length of d indicated in FIG. 12 is about the same as in the case where there is one trench T3 (is about the same as a length of d indicated in FIG. 8), a plurality of longer-and-thinner trenches T3 are formed in the same region, whereby the effective offset length can be further increased. Note that the number and size of the trenches T3, and intervals between each of the trenches T3 are not limited to those shown, and may be appropriately changed.

Figure 13B:
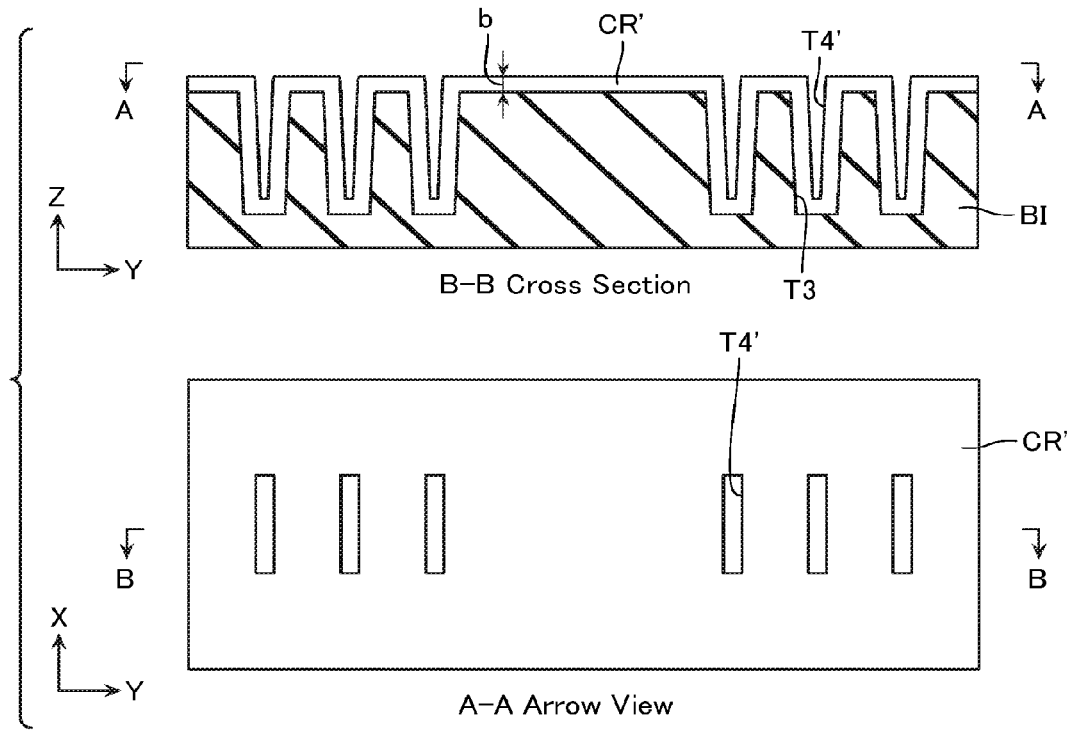

Next, as shown in FIG. 13B, polysilicon, for example, is deposited so as to follow a surface of the base insulating layer BI including a bottom surface and sidewall surface of the trench T3, whereby a channel semiconductor layer CR' is formed. At this time, by preventing the inside of the trench T3 from being completely filled, a trench T4' which will become the trench T4 in a later step, can be formed.

Figure 13C:
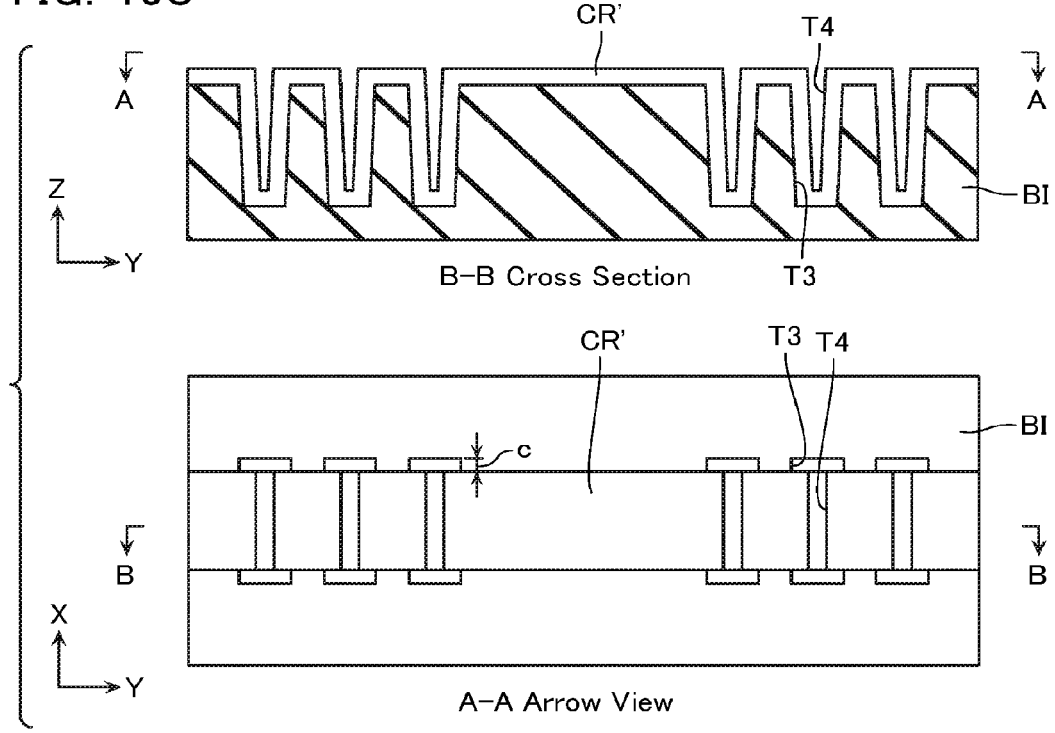

Next, as shown in FIG. 13C, in order that the channel semiconductor layer CR' on parts of the second region and the third region and part of the channel semiconductor layer CR' in the trench T3 are continuous, another part of the channel semiconductor layer CR' is removed by implementing anisotropic dry etching after patterning by photolithography, whereby the channel semiconductor layer CR' undergoes division processing in the X direction. As a result, an upper surface of the channel semiconductor layer CR' divided in the trench T3 becomes the trench T4. Moreover, division of the channel semiconductor layer CR' results in part of the trench T3 being exposed. At this time, the channel semiconductor layer CR', by undergoing division processing in the X direction without being divided in the Y direction, attains a shape extending as a whole in the Y direction so as to follow upper surfaces of the second region and the third region and a bottom surface and sidewall surface of the trench T3.

Figure 13D:
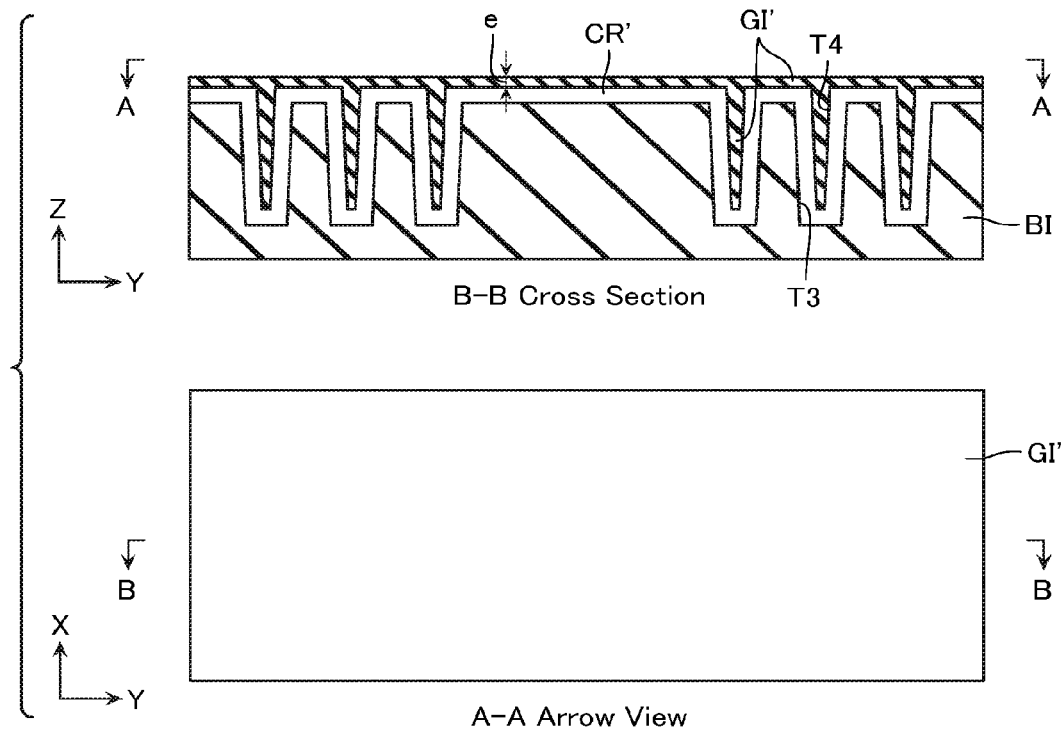

Next, the trenches T3 and T4 are embedded by an insulating layer similarly to in FIG. 9, but in the present embodiment, as shown in FIG. 13D, silicon oxide ($SiO_2$) which will become the gate insulating film GI' can be deposited on the channel semiconductor layer CR' so as to embed the trenches T3 and T4. By thus adjusting a width in the Y direction of the trench T3 in the step shown in FIG. 13A and a width in the Y direction of the trench T3 in the step shown in FIG. 13C, embedding by the embedded insulating layer EI and planarization processing can be omitted, and manufacturing costs can be lowered.

Specifically, in order for embedding by the embedded insulating layer EI to be omitted and for the trenches T3 and T4 to be embedded simultaneously to deposition of the gate insulating film GI', it becomes a condition that, if a width in the Y direction of an opening of the trench T3 is assumed to be a, a thickness of the channel semiconductor layer CR in a direction perpendicular to a surface of the base insulating layer BI including the trench T3 is assumed to be b, a distance between an end in the X direction of the opening of the trench T3 and an end in the X direction of that of the trench T4 shown in the lower portion of FIG. 13C is assumed to be c, and a thickness in the stacking direction of the gate insulating film GI shown in FIG. 13D is assumed to be e, then a≤2 (b+e) and c≤2e are satisfied. In the case that this condition cannot be satisfied, it is also possible for the trench T3 to be embedded by the embedded insulating layer EI and for planarization processing to be performed, similarly to in the first embodiment. The example shown in FIG. 13D shows a state where the trench T3 has been embedded simultaneously to deposition of the gate insulating film GI.

Figure 13E:
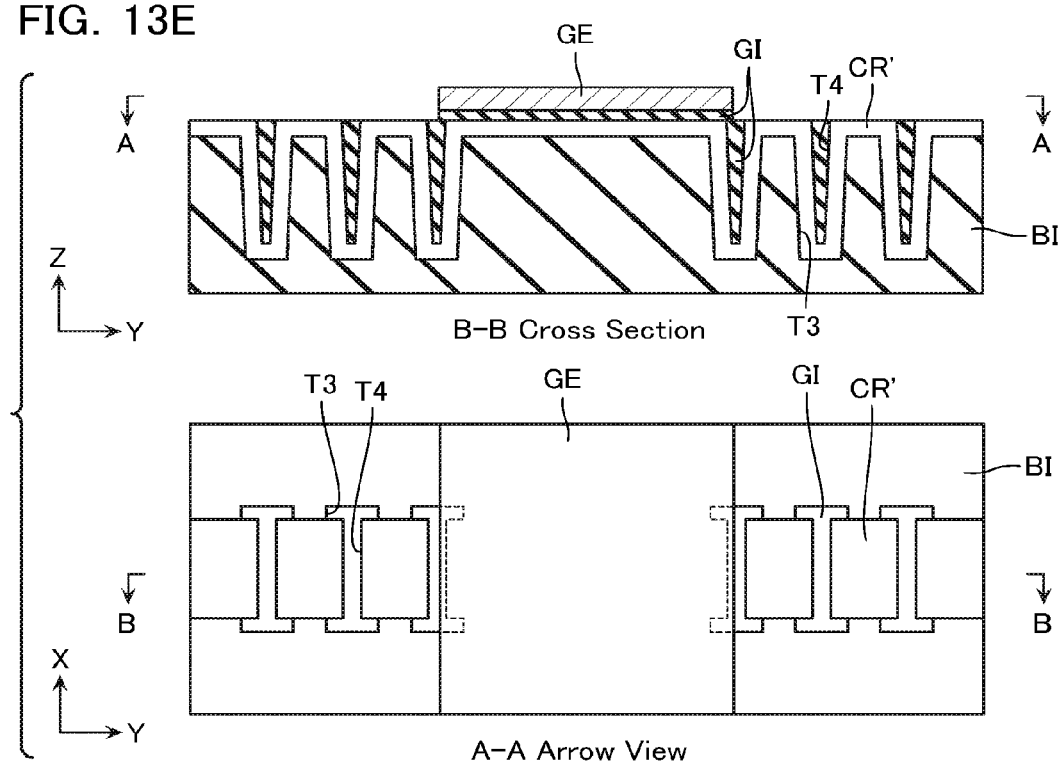

Next, as shown in FIG. 13E, for example, polysilicon to which an impurity has been added is deposited on the gate insulating film GI', and the gate electrode layer GE is formed. Implementing anisotropic dry etching after patterning by photolithography and performing division processing in the Y direction of the gate electrode layer GE' and the gate insulating film GI' results in a structure in which the channel semiconductor layer CR', the gate insulating film GI, and the gate electrode layer GE are disposed in this order on the second region. At this time, the gate insulating film GI' need not be divided. Moreover, the gate electrode layer GE is formed so as to overlap the channel semiconductor layer CR of a sidewall surface of the trench T4 adjacent to the second region. That is, a length in the X direction of the gate electrode layer GE is formed so as to be larger than a length in the X direction of the channel semiconductor layer CR on the second region.

Figure 13F:
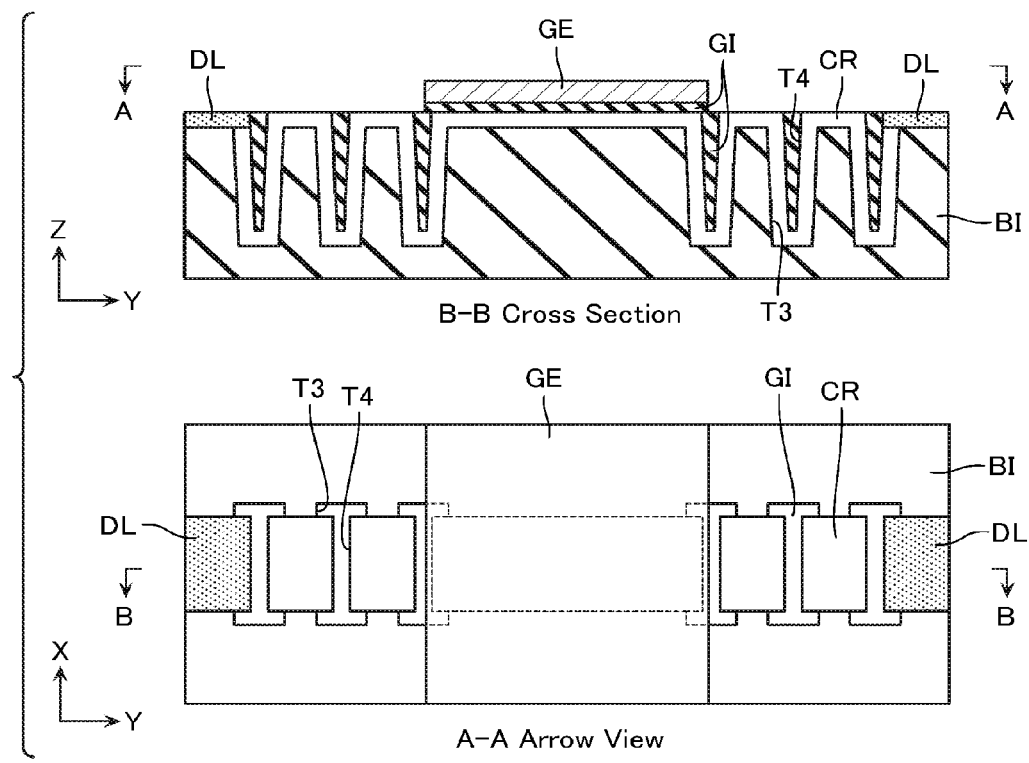

Next, as shown in FIG. 13F, after performing patterning in advance, an impurity is implanted in entire surfaces of the base insulating layer BI and the channel semiconductor layer CR' by the likes of ion implantation, and the diffusion layer DL is formed at both ends of the channel semiconductor layer CR, whereby the same structure as in FIG. 12 is formed. At this time, in a method where the impurity is implanted in entire surfaces, the impurity ends up being implanted also in part of the offset region, hence the impurity must be implanted after patterning has been performed in advance by photolithography, for example. Possible materials of the impurity are an impurity configuring an n type semiconductor, for example, a pentavalent element such as arsenic (As) and phosphorus (P), an impurity configuring a p type semiconductor, for example, a trivalent element such as boron (B) and indium (In), or a combination of these materials.

Figure 14:
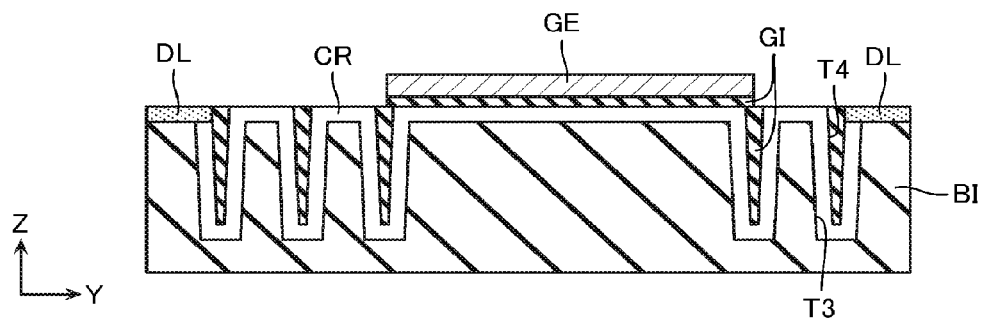
FIG. 14 shows a modified example of the transistor SWTr according to the second embodiment.

FIG. 14 is a cross-sectional view showing a modified example of the transistor SWTr according to the second embodiment. In this example, a plurality of the trenches T3 are respectively formed on both sides sandwiching the gate electrode layer GE, but the number of trenches T3 formed on both sides is different on the left and on the right. By changing the number of trenches T3 in this way, it is also possible to make a different offset length and, similarly to in the modified example shown in FIG. 11, to form a transistor SWTr in which a current is easily led out only from the diffusion layer DL on one side configuring a short offset.

As described above, even in the second embodiment, part of the channel semiconductor layer CR is formed so as to follow bottom surfaces and sidewall surfaces of the plurality of trenches T3 formed in the base insulating layer BI, and has a partly folded kind of shape. Forming in this way makes it possible for a transistor SWTr provided with a large offset region to be made small on a plane, and makes it possible to suppress an increase in area occupied by the word line connection circuit SW and reduce chip area as a whole.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in the above-described embodiments, the memory string of the NAND type flash memory adopts the semiconductor layer 35 extending linearly in the stacking direction. However, it is also possible to adopt a configuration of the kind where the offset region of the channel semiconductor layer CR of the transistor SWTr is folded, like that of the above-described embodiments, in a NAND type flash memory that has a structure in which the semiconductor layer 35 is instead folded back in a U shape, for example. Moreover, the configurations of the above-described embodiments are not limited to a three-dimensional type NAND type flash memory, and may also be applied to another three-dimensional memory, for example, a resistance varying memory, and so on. That is, the configurations of the above-described embodiments may be applied to various forms of three-dimensionally disposed memories.

What is claimed is:
1. A nonvolatile semiconductor memory device, comprising:
   a memory cell array including a memory cell;
   a wiring part connecting the memory cell array to an external circuit; and
   a transistor that connects the wiring part and the external circuit,
   the transistor comprising:
   a first insulating layer including a first region, a second region, and a third region, the second and third regions being disposed on both sides of the first region, and a height of an upper surface of the first region being lower than those of the second region and the third region;
   a semiconductor layer disposed along upper surfaces of the first region, the second region, and the third region; and
   a gate electrode layer disposed via the semiconductor layer and a gate insulating film, on an upper part of the second region.
2. The memory device according to claim 1, further comprising
   a second insulating layer disposed on the first region via the semiconductor layer.
3. The memory device according to claim 2, wherein
   the first insulating layer includes a plurality of the first regions whose upper surfaces are in a lower position than that of the second region is, on at least one side of the second region, and the third region is disposed between a plurality of the first regions.
4. The memory device according to claim 2, wherein
   the first insulating layer includes a plurality of the first regions whose upper surfaces are in a lower position than that of the second region is, on each of both sides of the second region, and the third region is disposed between a plurality of the first regions.

5. The memory device according to claim 2, wherein
a length of the gate electrode layer in a first direction from the second region to the third region along the upper surface of the second region is larger than a length in the first direction of the semiconductor layer on the second region.

6. The memory device according to claim 2, wherein
the semiconductor layer comprises an impurity layer at both ends of the semiconductor layer.

7. The memory device according to claim 1, wherein
the first insulating layer includes a plurality of the first regions whose upper surfaces are in a lower position than that of the second region is, on at least one side of the second region, and the third region is disposed between a plurality of the first regions.

8. The memory device according to claim 7, wherein
a plurality of the first regions have an aspect ratio of a sidewall surface and the upper surface which is larger than 1.

9. The memory device according to claim 7, wherein
a length of the gate electrode layer in a first direction from the second region to the third region along the upper surface of the second region is larger than a length in the first direction of the semiconductor layer on the second region.

10. The memory device according to claim 7, wherein
the semiconductor layer comprises an impurity layer at both ends of the semiconductor layer.

11. The memory device according to claim 1, wherein
the first insulating layer includes a plurality of the first regions whose upper surfaces are in a lower position than that of the second region is, on each of both sides of the second region, and the third region is disposed between a plurality of the first regions.

12. The memory device according to claim 11, wherein
a plurality of the first regions have an aspect ratio of a sidewall surface and the upper surface which is larger than 1.

13. The memory device according to claim 1, wherein
a length of the gate electrode layer in a first direction from the second region to the third region along the upper surface of the second region is larger than a length in the first direction of the semiconductor layer on the second region.

14. The memory device according to claim 1, wherein
the semiconductor layer comprises an impurity layer at both ends of the semiconductor layer.

15. The memory device according to claim 14, wherein
the semiconductor layer has an impurity concentration between the impurity layers which is 10 times or more less than that of the impurity layer.

* * * * *